US010559507B1

(12) United States Patent
Saketi et al.

(10) Patent No.: US 10,559,507 B1
(45) Date of Patent: Feb. 11, 2020

(54) DIRECT WAFER MAPPING AND SELECTIVE ELASTOMER DEPOSITION

(71) Applicant: Facebook Technologies, LLC, Menlo Park, CA (US)

(72) Inventors: Pooya Saketi, Cork (IE); Patrick Joseph Hughes, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/890,166

(22) Filed: Feb. 6, 2018

(51) Int. Cl.
*H01L 21/00* (2006.01)
*H01L 21/66* (2006.01)
*H01L 33/44* (2010.01)
*H01L 21/67* (2006.01)
*H01L 33/62* (2010.01)
*H01L 25/075* (2006.01)
*G01R 31/26* (2020.01)
*H01L 33/00* (2010.01)

(52) U.S. Cl.
CPC .......... *H01L 22/20* (2013.01); *G01R 31/2635* (2013.01); *H01L 21/67144* (2013.01); *H01L 25/0753* (2013.01); *H01L 33/0079* (2013.01); *H01L 33/44* (2013.01); *H01L 33/62* (2013.01); *H01L 2933/0025* (2013.01); *H01L 2933/0066* (2013.01)

(58) Field of Classification Search
CPC ......... H01L 22/20; H01L 33/44; H01L 33/62; H01L 33/0079; H01L 21/67144; G01R 31/2635
See application file for complete search history.

(56) References Cited

U.S. PATENT DOCUMENTS

| 6,936,855 B1* | 8/2005 | Harrah | F21K 9/00 257/59 |
| 2007/0001182 A1* | 1/2007 | Schardt | C09K 11/02 257/98 |
| 2007/0170933 A1* | 7/2007 | Ma | G01N 21/6489 324/754.03 |

* cited by examiner

*Primary Examiner* — Richard A Booth
(74) *Attorney, Agent, or Firm* — Fenwick & West LLP (57) ABSTRACT

LEDs are manufactured on a substrate layer and picked and placed using a pick-up tool (PUT) onto a target substrate. The PUT typically attaches to an LED via an elastomer layer deposited on a surface of the LED. A given batch of manufactured LEDs may contain operational LEDs as well as non-operational LEDs. In order to separate the operational and non-operational LEDs, the LEDs are placed on a unidirectional conductive film. A voltage difference applied across the electrodes of each LED via the unidirectional conductive film powers the LEDs and causes the operational LEDs to emit light. An electrical parameter of each LED is measured and used to determine whether each LED is operational or non-operational. An elastomer deposition apparatus selectively deposits elastomer material on the operational LEDs, allowing for the operational LEDs to be picked up using the PUT, while not depositing elastomer material on the non-operational LEDs.

12 Claims, 6 Drawing Sheets

DIRECT WAFER MAPPING AND SELECTIVE ELASTOMER DEPOSITION

BACKGROUND

The present disclosure relates to an assembly process for use in picking and placing of very small display element(s) from an initial substrate to a receiving substrate.

To populate a display with very small light emitting diodes (LEDs), such as micro-LEDs, there may be a need to transfer the LEDs from the native substrate on which they have been manufactured to a target substrate that forms part of a display, or "display substrate." Such small semiconductor devices may be assembled with a defined separation distance between them or closely packed together on the target substrate.

Because current LED manufacturing techniques do not result in perfects yields, any given batch of manufactured LEDs may contain non-operational LEDs. During assembly of the display, these non-operational LEDs should not be transferred to the display substrate.

SUMMARY

Embodiments relate to the picking and placing of semiconductor devices such as LEDs onto a target substrate using a pick-up tool (PUT). A batch of LEDs is formed on a substrate layer, which may contain operational LEDs and non-operational LEDs. In order to separate the operational from the non-operational LEDs and ensure that all LEDs placed onto a target substrate, the LEDs are placed onto a conductive surface or film. The conductive surface or film may comprise a unidirectional conductive film, such that a voltage difference can be applied to the electrodes of each LED through the film. The voltage difference can be applied using a plurality of probe pairs located on an opposite surface of the unidirectional conductive film. Each probe pair is placed at locations corresponding to the electrodes of a corresponding LED.

In one or more embodiments, one or more electrical parameters of each of the plurality of LEDs is measured when the voltage difference is applied across the electrodes of the LEDs. Because operational and non-operational LEDs will exhibit different electrical parameter values when powered, the measured parameters can be used to determine whether each LED is operational or non-operational. An elastomer material deposition apparatus may selectively deposit elastomer material onto a surface of each of the plurality of LEDs determined to be operational, while not depositing elastomer material on LEDs determined to be non-operational. As such, the PUT will only be able to pick up LEDs that are operational due to having an elastomer layer formed thereon, while not being able to pick up non-operational LEDs due to the lack of an elastomer layer formed thereon.

BRIEF DESCRIPTION OF THE DRAWINGS

Figure (FIG. 1 is schematic diagram illustrating a display fabrication system, in accordance with one embodiment.

The figures depict embodiments of the present disclosure for purposes of illustration only.

DETAILED DESCRIPTION

Embodiments relate to selective picking and placing of semiconductor devices, such as light emitting diodes (LEDs), in order to identify and separate operational semiconductor devices from non-operational semiconductor devices. LEDs may be manufactured by forming an LED die (also referred to as an epitaxial layer) on a substrate layer (e.g., a glass or sapphire substrate). The LEDs are removed from the substrate layer and placed on an intermediate film or carrier substrate, whereupon they may be placed onto a target substrate that forms part of a display, or "display substrate." A pick-up tool (PUT) is used to pick one or more LEDs on the intermediate film or carrier substrate and place the LEDs onto the display substrate. In some embodiments, the display substrate may also be referred to as a device substrate. The intermediate film or carrier may comprise a unidirectional conductive film, allowing for the LEDs to be powered using one or more probes. By powering the LEDs and measuring their resulting electrical parameters, operational LEDs can be selected for pick up and placing on the display substrate.

As used herein, an LED is considered operational if the LED, when a given voltage difference is applied across the electrodes of the LED, exhibits certain electrical parameters (e.g., an amount of current transmitted through the electrodes of the LED) consistent with the emission of at least a threshold amount of light by the LED. On the other hand, an LED is considered non-operational if the LED exhibits electrical parameters consistent with the emission of no light or less than the threshold amount of light, in response to the voltage difference being applied across the electrodes of the LED.

In order to differentiate operational LEDs from non-operational LEDs, the LEDs may be placed on a conductive surface or film. As used herein, a conductive surface comprises a surface capable of conducting a current across a thickness of the surface but not along the width and/or length direction of the surface. As such, a voltage difference can be provided across the electrodes of each of the LEDs placed on the conductive surface (e.g., via probes placed on an opposite side of the conductive surface), causing the LEDs to emit light (if operational).

Example System for LED Display Fabrication

In order to pick and place the LEDs using a PUT, a layer of interface material may be deposited on each of the LEDs. A head of the PUT contacts the interfacing material in order to pick up the LED. In some embodiments, the interfacing material comprises a polymer material having elastic (e.g., an elastomer material) or adhesive properties. As used herein, the layer of interfacing material may hereby also be referred to as an "elastomer layer" or "elastomer coating" formed from an "elastomer material."

Due to imperfections in the manufacturing process, a portion of the LEDs formed on the substrate layer may be non-operational. In order to ensure that the non-operational LEDs are not picked and placed onto the display substrate, the LEDs are placed on an intermediate film or layer that is configured such that a voltage difference can be applied across the electrodes of each of the LEDs, the voltage difference being sufficient to power the LED and cause the LED to produce light (if operational). When the voltage difference is applied across each of the LEDs, one or more electrical parameters of each LED is measured. For example, a measured electrical parameter may correspond to an amount of current drawn by each LED when the voltage difference is applied across the electrodes of the LED. The LED is determined to be operational or non-operational, based upon the measured electrical parameters. Elastomer material is deposited only on LEDs determined to be operational in order to form an elastomer layer on each operational LED, and not deposited on LEDs determined to not be operational.

In order to pick up the LEDs, a head of a PUT is moved towards the LEDs, such that the PUT head comes within a certain proximity of the elastomer layer deposited on the operational LEDs. However, because the non-operational LEDs do not contain an elastomer layer, the PUT head is unable to pick up the non-operational LEDs. As such, the PUT only picks up LEDs that are operational, and does not pick up any LEDs that are non-operational. Because the LEDs picked up by the PUT are known to be operational, they may be referred to as "known good die" or KGD.

In some embodiments, LEDs picked up by the PUT are placed directly on a display substrate. In some embodiments, the LEDs picked up by the PUT are placed on another carrier substrate to populate the substrate only with known good dies (KGDs). This new substrate which has 100% yield may be referred to as a KGD wafer.

Figure 1:
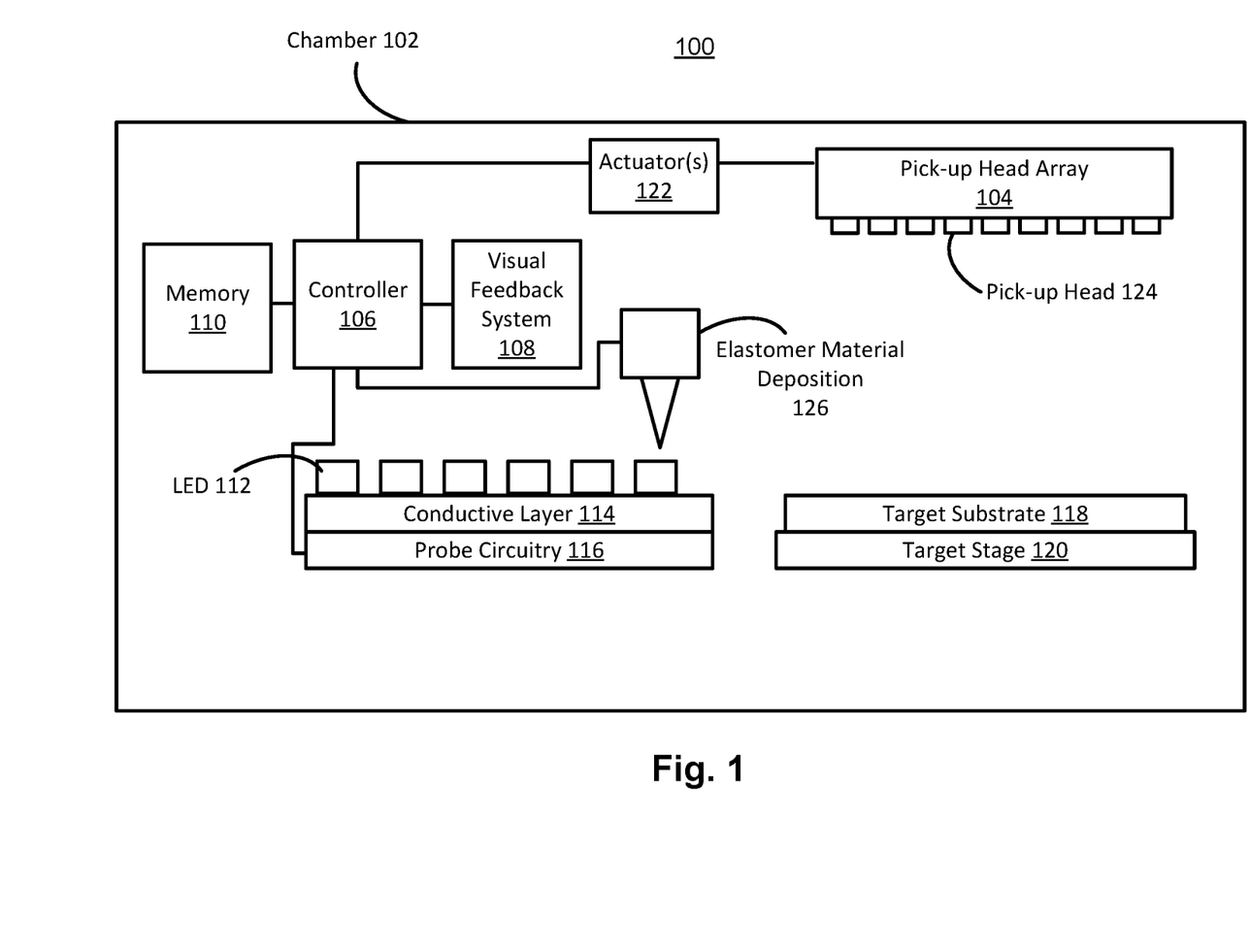

FIG. 1 is a block diagram illustrating a display fabrication system 100, in accordance one embodiment. The system 100 fabricates a display device by assembling LEDs 112 from a conductive layer 114 to a target substrate 118. In some embodiments, subsets of the LEDs 112 emit different colored light. The conductive layer 114 may be a unidirectional conductive film that holds the LEDs 112 for pick up by the pick-up head array.

The target substrate 118 may be a display substrate, or may be an intermediate carrier substrate that facilitates bonding of the LEDs 112 with a display substrate. The system 100 places LEDs 112 at pixel locations of the display substrate, and then bonds the LEDs 112 to the display substrate. In some embodiments, the LEDs 112 are micro-LEDs, or μLEDs, having a reduced divergence of light output and small light emitting area is comparison to conventional LEDs. A μLED as described herein refers to a particular type of LED having a small active light emitting area (e.g., less than 2,000 μm$^2$). In some embodiments, a μLED may be configured to have collimated light output. The collimated light output increases the brightness level of light emitted from the small active light emitting area and prevents the spreading of emitted light into the beampath of invisible light used by light detectors and non-visible LEDs adjacent to the μLED. While the application discusses primarily μLEDs, it is understood that in other embodiments, the LEDs 112 may comprise any semiconductor device capable of emitting light.

The system 100 may include, among other components, a chamber 102 defining an interior environment for picking and placing LEDs 112 within the chamber 102. The system 100 further includes a pick-up head array 104, a visual feedback system 108, an actuator 122, probe circuitry 116, a target stage 120, and an elastomer material deposition apparatus 126, within the chamber 102. The probe circuitry 116 comprises circuitry for powering the LEDs 112 through the conductive layer 114. The target stage 120 holds a target substrate 118 to receive some or all of the LEDs 112 from the conductive layer 114. A controller 106 is coupled to the visual feedback system 108, the pick-up head array 104 (e.g., via the actuator 122), the elastomer material deposition apparatus 126, and the probe circuitry 116, and controls the operations of the aforementioned components. For example, the controller 106 causes the pick-up head array 104 to pick up one or more LEDs 112 located on a conductive layer 114, and place the one or more semiconductor devices on the target substrate 118. The controller 106 is coupled to a memory 110, which stores instructions that may be executed by the controller 106 to perform operations using the pick-up head array 104, elastomer material deposition apparatus 126, visual feedback system 108, and/or the like. The memory 110 may comprise a database or other type of non-transitory storage medium.

The pick-up head array 104 may include a plurality of pick-up heads 124. Each pick-up head 124 can pick up one or more LEDs 112 from the conductive layer 114, and place the semiconductor device on the target substrate 118. After picking up one or more LEDs 112, the pick-up head 124 is aligned with a location on the target substrate 118. The pick-up head 124 is then separated from the LED 112 after placing the LED 112 at the location on the target substrate 118.

The actuator 122 is an electro-mechanical component that controls the movement of the pick-up head array 104 based on instructions from the controller 106. For example, the actuator 122 may move the pick-up head array 104, or individual pick-up heads 124, with three degrees of freedom including up and down, left and right, and forward and back. The actuator 122 may be embodied, for example, as a rotating motor, a linear motor or a hydraulic cylinder.

The visual feedback system 108 facilitates a visual alignment for semiconductor device pick-up from the conductive layer 114, and alignment for semiconductor device placement on the target substrate 118. For example, the visual feedback system 108 generates images of the pick-up head array 104 and the conductive layer 114, and provides the images to the controller 106. The controller 106 aligns the one or more pick-up heads 124 of the pick-up head array 104 with the conductive layer 114 based on the images, and picks up one or more LEDs 112 mounted on the conductive layer 114. In another example, the visual feedback system 108 generates images of the one or more pick-up heads 124 of the pick-up head array 104 and the target substrate 118, and provides the images to the controller 106. The controller 106 aligns the one or more pick-up heads 124 with the target substrate 118 based on the images, and places the LEDs 112 attached to the one or more pick-up heads 124 on the target substrate 118. In some embodiments, the visual feedback system 108 comprises a scanning electron microscope (SEM). In other embodiments, the visual feedback system 108 may comprise an optical vision system.

In some embodiments, the visual feedback system 108 is an environmental scanning electron microscope (ESEM) to provide images without specimen coating. The chamber 102 is an ESEM chamber including a high pressure atmosphere of water vapor. The use of an SEM may be advantageous for picking and place small semiconductor devices, such as micro-LED dies because of the SEM's ability to capture accurate images of small objects. In various embodiments, other types of imaging devices may be used to facilitate the alignments.

In some embodiments, the target stage 120 may be adjusted to facilitate precision alignment with the pick-up head array 104. For example, the target stage 120 may include three degrees of freedom. The degrees of freedom may include left and right, backward and forward, and a yaw rotational degree of freedom. The target substrate 118 is moved with the target stage 120.

In some embodiments, the LEDs 112 may have been placed on the conductive layer 114 from one or more carrier substrates (not shown). For example, different carrier substrates may carry different color LED dies.

In some embodiments, the LEDs 112 may be placed on several different carrier substrates prior to placement on the conductive film 114. For example, after the LEDs 112 are initially formed on a substrate layer (not shown), the LEDs 112 may be attached to a rigid carrier substrate and removed from the substrate layer using a laser lift-off (LLO) process. The LEDs 112 may subsequently be transferred from the rigid carrier substrate to the conductive layer 114. The conductive layer 114 may be a film or a tape that holds singulated LEDs 112 for transfer to the target substrate 118. In some embodiments, the conductive layer 114 comprises a unidirectional conductive film.

The system 100 may include one or more target substrates 118. In some embodiments, such as when the target substrate 118 is the display substrate for receiving the LEDs 112, the target stage 120 includes a heater for thermal conductive bonding of the electrical contact pads of the LEDs 112 to the target substrate 118 subsequent to placement of the LEDs 112 on the target substrate 118 by the pick-up head 104. In other embodiments, the target substrate 118 is an intermediate carrier substrate that is used to facilitate direct bonding of the LEDs 112 with a separate target substrate 118.

The elastomer material deposition apparatus 126 comprises an apparatus for depositing an elastomer material on a surface of one or more of the LEDs 112. In some embodiments, the elastomer material deposition apparatus 126 deposits the elastomer material on the surface of the one or more LEDs 112 in liquid form. The deposited elastomer material may then be cured to form an elastomer layer on each of the one or more LEDs 112.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

Example MicroLED

Figure 2A:
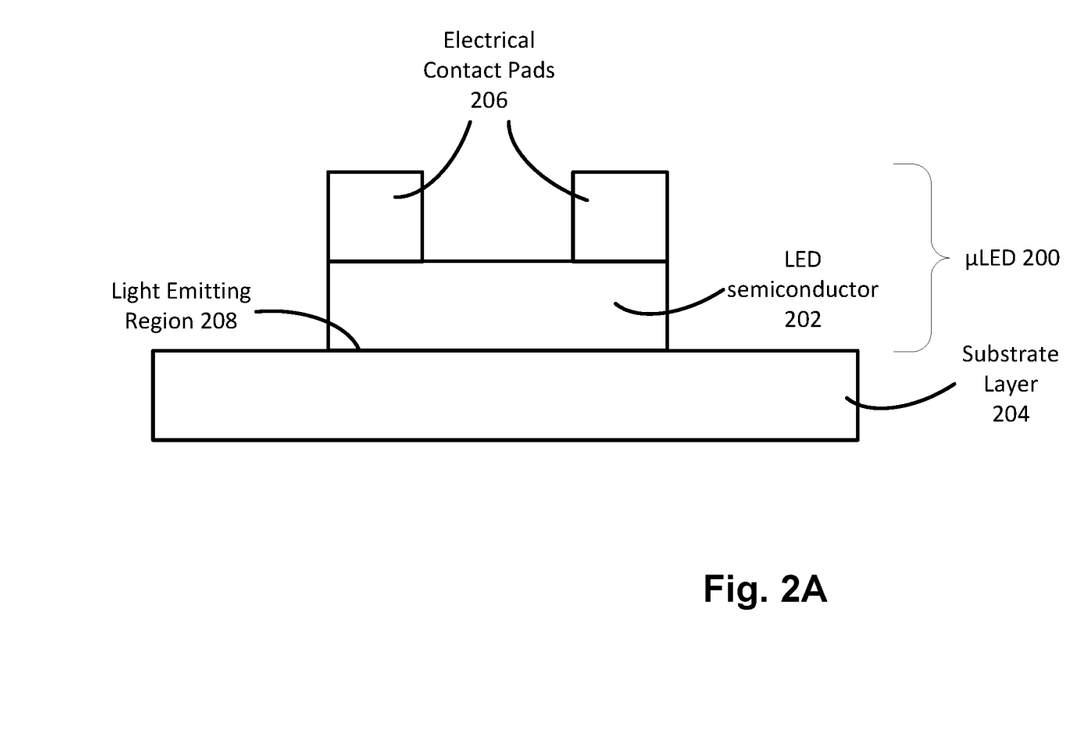
FIGS. 2A through 2C illustrate schematic diagrams of a μLED, in accordance with some embodiments.
Figure 2B:
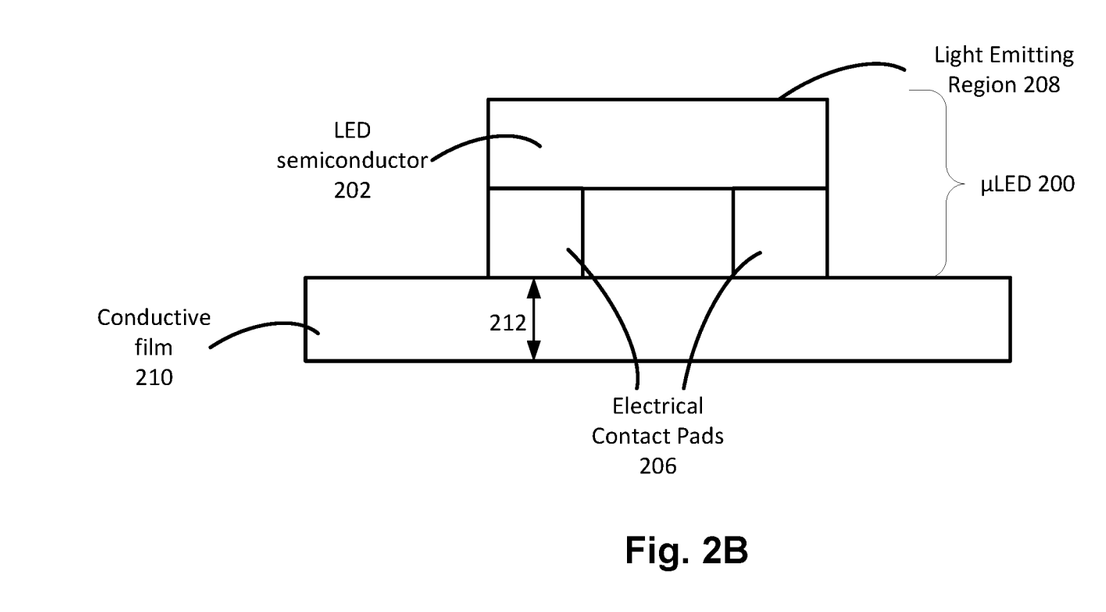
Figure 2C:
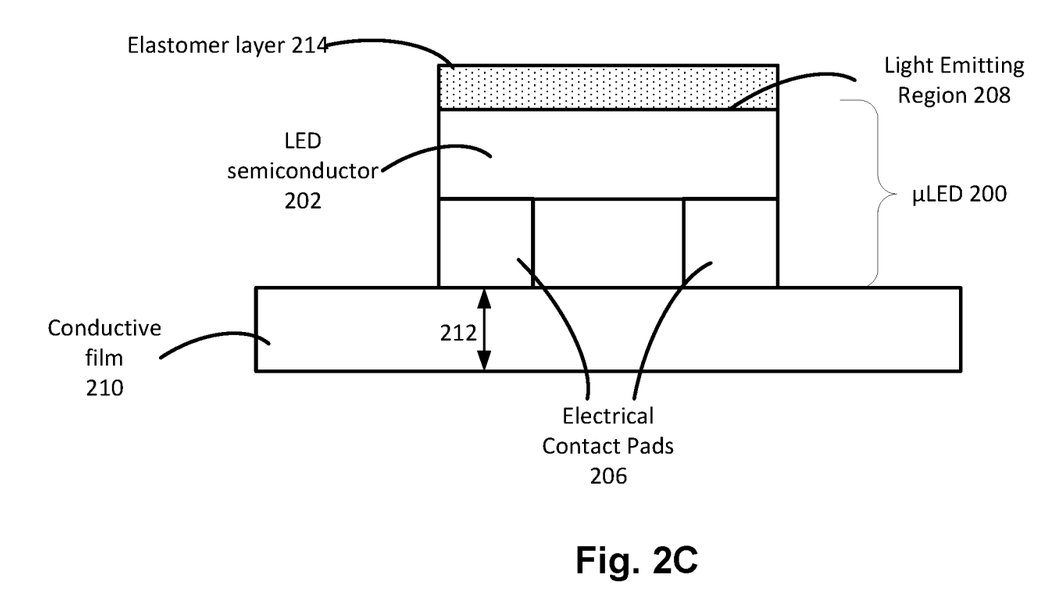

FIGS. 2A through 2C illustrate schematic diagrams of a μLED, in accordance with some embodiments. As illustrated in FIG. 2A, the μLED 200 comprises an LED body 202 formed on a substrate layer 204. In some embodiments, the substrate layer 204 comprises a rigid material such as glass or sapphire. In some embodiments, the LED body 202 comprises, among others, a gallium compound as such gallium nitride (GaN) or gallium arsenide (GaAs). The material of the LED body 202 and the substrate layer 204 may be different for different types of LEDs.

The μLED 200 further comprises a pair of electrodes 206 formed on a surface of the LED body 202 not adjacent to the substrate layer 204. During operation of the μLED 200, a voltage difference is applied across the pair of electrodes 206 to cause the μLED 200 to emit light at its quantum well region and through a light emitting surface 208 (which is covered by the substrate layer 204 when the μLED 200 is still attached to the substrate layer 204).

In some embodiments, the μLED 200 is removed from the substrate layer 204 using a laser lift-off (LLO) process. For example, a surface of the LED body 202 adjacent to the substrate layer 204 is exposed to a laser (not shown) that detaches the LED body 202 from the substrate layer. In some embodiments, a carrier substrate (not shown) is bonded to the μLED 200 via the electrodes 206 prior to removing the substrate layer 204 using the LLO process. The carrier substrate may be a rigid substrate that holds the μLEDs formed on the substrate layer 204 in place relative to each other as the substrate layer 204 is removed.

FIG. 2B illustrates a schematic diagram of the μLED 200 removed from the substrate layer 204 and placed on a conductive film 210, in accordance with some embodiments. For example, a pick-up tool or other apparatus may pick up a batch of μLEDs simultaneously or individual μLEDs from a carrier substrate and place the μLEDs onto the conductive film 210. The μLED 200 contacts the conductive film 210 via the electrodes 206. In some embodiments, the conductive film 210 comprises a flexible film that is stretched such that the surface of the conductive film 210 is flat and taut.

The conductive film 210 is unidirectionally conductive. That is, the conductive film 210 is conductive across a thickness of the film (illustrated in FIG. 2B as the vertical direction 212) but not conductive along the width and/or length direction. As such a current supplied to one side of the conductive film 210 is conducted to the opposite side of the conductive film 210 (e.g., from bottom to top or vice versa), but is not conducted along the lateral length, width or surface of the conductive film 208 (e.g., horizontal direction in FIG. 2B).

FIG. 2C illustrates a schematic diagram of the μLED 200 with an elastomer layer 214, in accordance with some embodiments. In order to pick and place the μLED 200, the elastomer layer 214 is deposited on a surface of the μLED 200 (e.g., on the light emitting surface 208 of the μLED 200). In some embodiments, the elastomer layer 214 comprises elastomer material deposited by an elastomer material dispenser (e.g., the elastomer material deposition apparatus 126 illustrated in FIG. 1) in the form of a fluid, and then cured or otherwise solidified to form the elastomer layer 214.

In some embodiments, the elastomer layer 214 on the surface of the μLED 200 may have at least a predetermined thickness. A head of a pick-up tool (PUT) (not shown) can attach to the μLED 200 by being lowered to within the predetermined distance from the surface of the μLED 200, such that the PUT head comes within a certain proximity of the elastomer layer 214 on the μLED 200. The elastomer layer 214 attaches to the PUT head, allowing the PUT head to pick up the μLED 200 and move the μLED 200 to another location (e.g., to a target substrate). In some embodiments, the elastomer layer 214 is conformable, allowing for substantially uniform adhesion distribution between the elastomer layer 214 and the PUT head.

Selective Pick and Place Mechanism

Current manufacturing techniques for μLEDs are generally not able to guarantee perfect yield. As such, for any given batch of manufactured μLEDs, one or more μLEDs within the batch may be non-operational. A μLED is considered operational if the μLED, when a given voltage difference is applied across the electrodes of the μLED, emits at least a threshold amount of light. On the other hand, a μLED is considered non-operational if it emits no light or emits less than the threshold amount of light when the voltage difference is applied across the electrodes of the μLED. In some embodiments, one or more electrical parameters of the μLED may be different depending upon whether the μLED is operational or non-operational. For example, an operational μLED, when powered by having a given voltage difference applied across its electrodes, may draw a different amount of current compared to a μLED that in non-operational. As such, by measuring the values of one or more electrical parameters of a μLED while the μLED is powered, whether or not the μLED is operational can be determined.

Figure 3:
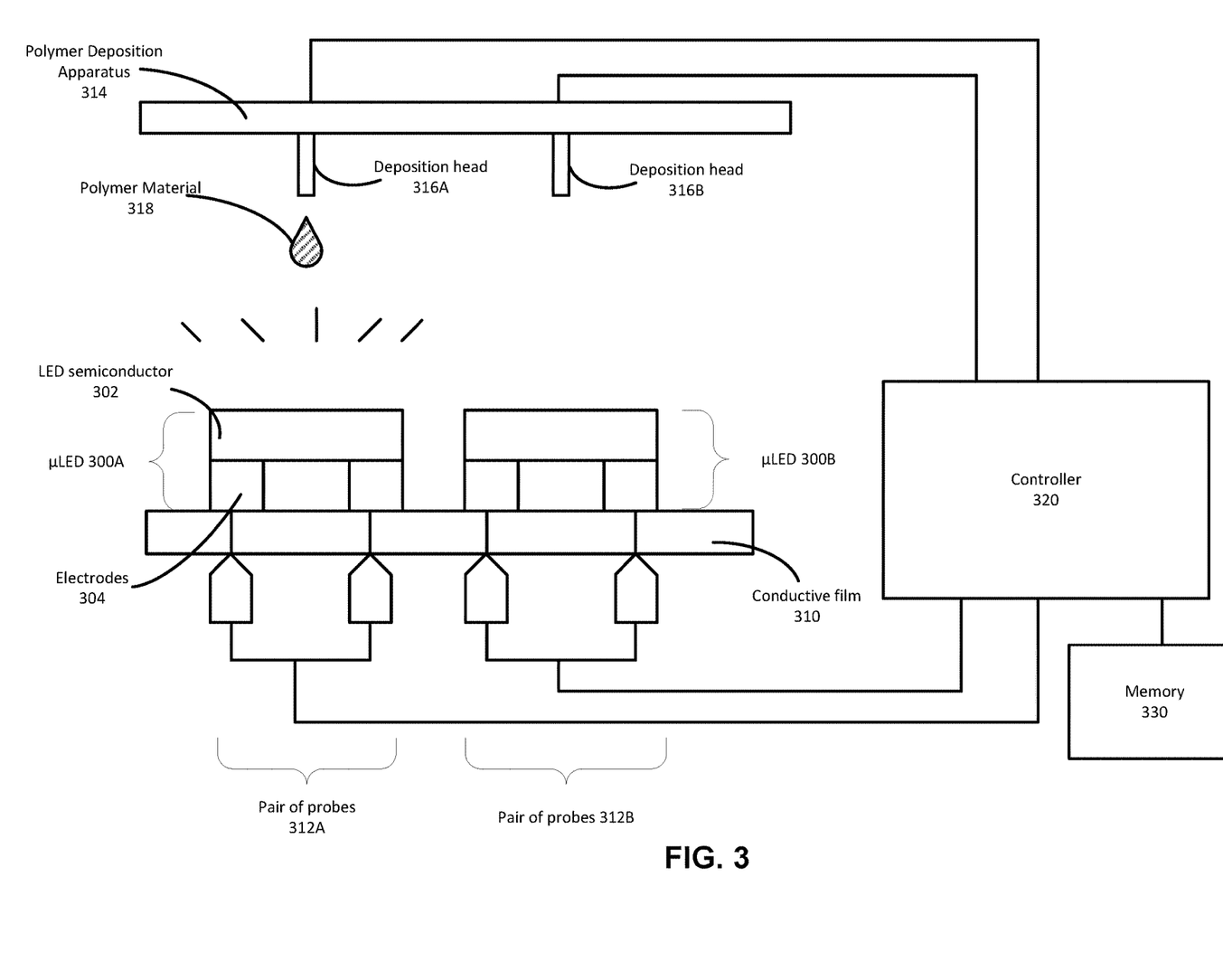
FIG. 3 illustrates a system for selective deposition of elastomer material on μLEDs, in accordance with some embodiments.

FIG. 3 illustrates a system for selective deposition of elastomer material on μLEDs, in accordance with some embodiments. A plurality of μLEDs 300, including a first μLED 300A and a second μLED 300B, are placed onto a surface of a unidirectional conductive film 310. Each μLED 300 comprises an LED semiconductor 302 and a pair of electrodes 304.

One or more pairs of probes 312 (e.g., a first pair 312A and a second pair 312B) are positioned on a surface of the conductive film 310 opposite from locations where the electrodes 304 of the μLEDs 300 are placed. The pairs of probes 312 may form a portion of the probe circuitry 116 illustrated in FIG. 1. Each pair of probes 312 is placed corresponding to the electrodes 304 of a corresponding μLED 300, and can be powered to operate the corresponding μLED 300 on the opposite side of the conductive film 310. For example, a voltage difference may be applied across each pair of probes 312 for a predetermined time period, which causes transmission of a current across the thickness direction of the conductive film 310 to power each of the μLEDs.

An elastomer deposition apparatus 314 (which may correspond to the elastomer material deposition apparatus 126 illustrated in FIG. 1) is configured to deposit elastomer material on one or more of the μLEDs 300. In some embodiments, the elastomer deposition apparatus 314 comprises a plurality of deposition heads 316, each corresponding to a particular μLED 300, through which elastomer material can be deposited on a surface of the corresponding μLED 300. For example, as illustrated in FIG. 3, the elastomer deposition apparatus 314 comprises at least a first deposition head 316A that can deposit elastomer material on the first μLED 300A, and a second deposition head 316B may deposit elastomer material of the second μLED 300B. In other embodiments, the elastomer deposition apparatus 314 comprises an actuator or other apparatus (not shown) usable to move at least one deposition head 316 to different locations corresponding to different μLEDs 300 placed on the conductive film 310. For example, instead of having first and second deposition heads 316, the elastomer deposition apparatus 314 may comprise a deposition head 316 moveable between a first and a second location corresponding to the first μLED 300A and the second μLED 300B respectively, such that the same deposition head 316 can be used to deposit elastomer material on the first μLED 300A or the second μLED 300B. In some embodiments, each deposition head 316 is configured to deposit a predetermined amount of elastomer material on a corresponding μLED 300 in liquid form, which may be cooled or cured to form an elastomer layer for the corresponding μLED 300.

A controller 320 (which may be implemented as part of the controller 106 illustrated in FIG. 1) is configured to generate instructions controlling the operation of probe pairs 312 and the elastomer deposition apparatus 314. In some embodiments, the instructions may be stored in a memory 330 (which may correspond to at least a portion of the memory 110 illustrated in FIG. 1) in communication with the controller 320, wherein the controller 320 executes the instructions to the control the operations of the probe pairs 312 and elastomer deposition apparatus 314.

The controller 320 may generate instructions for the probe pairs 312A and 312B to apply a predetermined voltage difference across the electrodes of the corresponding μLEDs 300A and 300B over respective time periods. The voltage difference is configured to be sufficient to power each of the μLEDs 300 to emit light at or above a threshold amount (if operational).

In some embodiments, a plurality of probe pairs 312 (e.g., the probe pairs 312A and 312B) may apply the voltage difference across the electrodes of the corresponding μLEDs 300 simultaneously. In other embodiments, different probe pairs 312 are instructed by the controller 320 to apply the voltage difference across the electrodes of the corresponding μLED over different time periods to power the μLED.

As discussed above, for a given batch of manufactured μLEDs, one or more of the μLEDs may be non-operational. For example, in the embodiment illustrated in FIG. 3, the first μLED 300A is operational, while the second μLED 300B is non-operational. As such, when powered through the respective pairs of probes 312A and 312B, the μLED 300A will emit light of at least a threshold level, while the μLED 300B will not emit light or only emit light less than the threshold level.

An operational μLED (e.g., μLED 300A) will exhibit different electrical parameter values when powered, compared to a non-operational μLED (e.g., μLED 300B). For example, an operational μLED may draw a different amount of current compared to a non-operational μLED, have a different voltage difference across its electrodes 304, and/or the like. The controller 320 may receive measurements of one or more electrical parameters of each of the μLEDs 300 while the μLED is powered via its corresponding probe pair 312. In some embodiments, the one or more electrical characteristics are measured through the corresponding probe pairs 312 of each μLED 300.

By measuring one or more electrical parameters of each μLED 300, the controller 320 determines whether each respective μLED 300 is operational or non-operational. For example, the controller 320 may compare one or more measured electrical parameter values of a μLED 300 to one or more corresponding threshold values. If the measured electrical parameters of the μLED 300 satisfy the threshold values, then the μLED 300 may be determined to be operational. Otherwise, the μLED 300 is determined to be non-operational.

Based upon the determination, the controller 320 generates instructions to control the elastomer deposition apparatus 314 to deposit elastomer material on only the μLEDs determined to be operational, and not on the non-operational μLEDs. For example, in some embodiments, each deposition head 316 of the elastomer deposition apparatus 314 comprises a valve that can be opened or closed based upon instructions from the controller 320. In the example illustrated in FIG. 3, the valve of the deposition head 316A is opened to deposit elastomer material 318 onto a surface of the operational μLED 300A, while the valve of the deposition head 316B is kept closed, such that no elastomer material is deposited on the non-operational μLED 300B.

In some embodiments, the controller 320 may also generate instructions for moving a deposition head 316 of the elastomer deposition apparatus 314 between different locations. For example, in an embodiment where the elastomer deposition apparatus 314 contains fewer deposition heads 316 compared to μLEDs 300, the deposition heads 316 are moved to locations corresponding to operational μLEDs of the μLEDs 300, in order to deposit elastomer material on the operational μLEDs.

After the elastomer material is deposited on the operational μLEDs 300, the elastomer material may be dried or cured to form a polymer layer on each operational μLED 300. A pick-up tool (PUT) head may be used to pick and place the μLEDs 300. In some embodiments, the PUT head comprises multiple pick-up surfaces for picking up multiple μLEDs at once. In other embodiments, the PUT head comprises a single pick-up surface, which is moved over different locations to pick up different μLEDs.

The PUT head is operated to move the pick-up surfaces to within a threshold distance of each μLED 300, such that the pick-up surfaces comes within a certain proximity of the elastomer layer formed on the surface of the μLED 300, if one exists. For example, when a pick-up surface of the PUT is moved to within the threshold distance of the μLED 300A, the elastomer layer formed on the μLED 300A is able to form an adhesive or elastomeric bond with the pick-up surface, allowing the PUT head to pick up and move the μLED 300A to a destination location, such as a display substrate or an intermediate carrier substrate. The elastomer layer may be conformable, allowing for substantially uniform adhesion between the elastomer layer and the PUT head, thus facilitating pick-up by the PUT head.

However, when the pick-up surface of the PUT is moved to within a threshold distance of the μLED 300A, the pick-up surface does not come within proximity of a elastomer layer on the μLED 300B, as the μLED 300B, being non-operational, did not have elastomer material deposited on its surface. As such, the PUT is unable to pick up the μLED 300B.

By placing manufactured μLEDs onto a conductive surface such that they can be powered, and measuring electrical parameters of each of the μLEDs to determine whether or not they are operational, elastomer material for attachment to a PUT head can be selectively deposited, allowing for the operational and non-operational μLEDs in a given batch of μLEDs to be separated. The operational μLEDs may be moved directed onto a display substrate, or placed onto an intermediate carrier substrate to form a known good die, where every μLED on the substrate has been determined to be operational, while the non-operational μLEDs are left behind and not picked up by the PUT.

Process Flow

Figure 4:
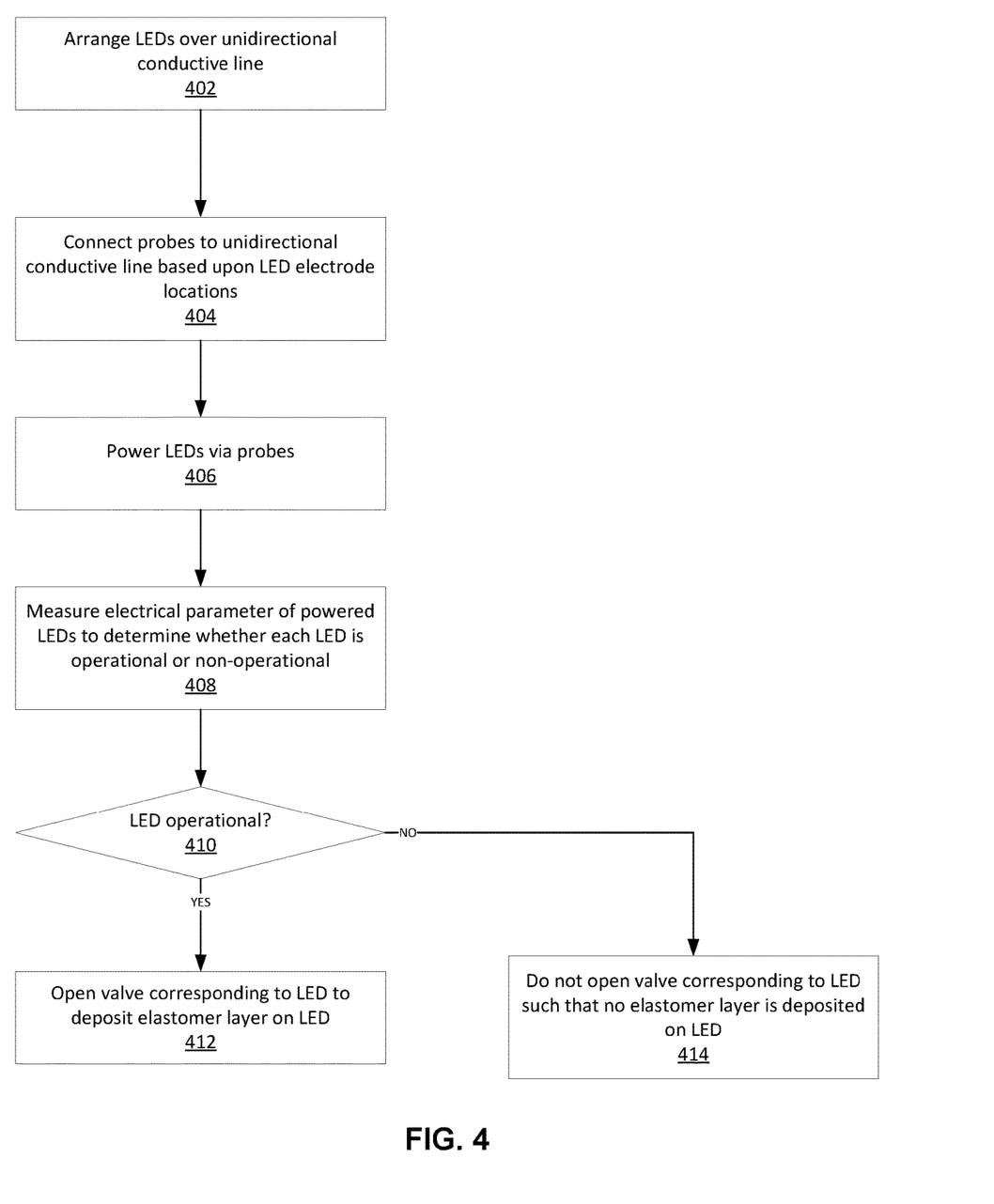
FIG. 4 illustrates a flowchart of a process for selectively picking and placing LEDs, in accordance with some embodiments.

FIG. 4 illustrates a flowchart of a process for selectively picking and placing LEDs, in accordance with some embodiments. In some embodiments, the steps of the illustrated process may be stored in a memory (e.g., the memory 110 illustrated in FIG. 1) and executed by a processor or controller (e.g., the controller 106) of a fabrication system. A plurality of LEDs are arranged 402 over a unidirectional conductive line. In some embodiments, the unidirectional conductive line comprises a conductive film or tape that is conductive in the direction corresponding to the thickness of the film or tape. The film or tape may be stretched such that the unidirectional conductive line remains substantially flat. In some embodiments, the plurality of LEDs comprise μLEDs formed on a substrate layer (e.g., a glass or sapphire substrate) that have been separated from the substrate layer (e.g., through an LLO process), and transferred onto the unidirectional conductive line (e.g., via one or more carrier substrates). Each of the LEDs comprises at least a pair of electrodes in contact with the unidirectional conductive line.

A plurality of probes are connected 404 to the unidirectional conductive line based upon the locations of the LED electrodes on the unidirectional conductive line. The plurality of probes may comprise pairs of probes, each pair of probes connected to a location on a surface of the unidirectional conductive line opposite from a pair of electrodes of a corresponding LED.

A controller instructs 406 a voltage difference to be applied across each of the plurality of probes to power each of the plurality of LEDs through the unidirectional conductive film. Due to imperfect yields of the LED manufacturing process, not all of the plurality of LEDs may be operational. When the voltage difference is applied to the probes, operational LEDs of the plurality of LEDs will emit light, while non-operational LEDs will not emit light. In some embodiments, an LED may be considered non-operational if it emits less than a threshold amount of light when powered.

The controller receives 408 measurements of one or more electrical parameters of each of the powered LEDs, in order to determine whether each LED is operational or non-operational based upon the received measurements. The electrical parameters may comprise a measured current drawn by each powered LED, a voltage difference across the electrodes of each powered LED, and/or the like. The some embodiments, the electrical parameters are measured using the probe pairs corresponding to each powered LED.

Because the electrical characteristics of an operational LED will typically be different from that of a non-operational LED, the controller is able to determine 410 whether each powered LED is operational or non-operational. For example, in some embodiments, an operational LED may draw a greater amount of current in comparison to a non-operational LED. As such, if the controller determines that the measured current level drawn by a particular LED is above a threshold value, then the controller may determine that the LED is operational. On the other hand, if the measured current is below the threshold value, the LED may be determined to be non-operational.

If an LED is operational, then the controller instructs 412 an elastomer deposition apparatus to deposit elastomer material on a surface of the LED. The elastomer material may be dried or cured to form an elastomer layer on the LED. On the other hand, if an LED is determined to be non-operational, the controller instructs 412 the elastomer deposition apparatus to not deposit elastomer material on the LED. In some embodiments, the elastomer deposition apparatus comprises one or more deposition heads, each positioned over a respective LED. Each deposition head may comprise a valve which may be opened to allow for elastomer material to be deposited on the corresponding LED, or closed to prevent elastomer material from being deposited on the corresponding LED. In some embodiments, one or more deposition heads of the elastomer deposition apparatus may be moved to different locations corresponding to different operational LEDs, in order to deposit elastomer material on the LEDs.

Once elastomer material has been deposited on the LEDs determined to be operational to form elastomer layers on each of the operational LEDs, a head of a PUT is lowered over one or more of the LEDs and used to pick and place the operational LEDs. For example, the PUT head may be lowered to within a threshold distance of one or more LEDs, such that LEDs having an elastomer layer formed thereon (e.g., operational LEDs) are attached to the PUT head, while LEDs not having an elastomer layer formed thereon (e.g., non-operational LEDs) are not attached to the PUT head. As such, the PUT head will only be able to pick up operational LEDs, and not non-operational LEDs. In some embodiments, the picked up LEDs are placed onto a display substrate to form a portion of a display. In other embodiments, the LEDs are placed onto an intermediate carrier substrate to form a known good die of LEDs, wherein each LED placed on the substrate is known to be operational.

By operating each a plurality of LEDs to emit light and measuring the resulting electrical parameters of the LED, operational and non-operational LEDs can be differentiated, such that only operational LEDs are picked and placed using the PUT. This allows for known good die of LEDs to be assembled, and for LEDs displays to be constructed using only LEDs known to operational.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    applying a voltage difference across electrodes of each of a plurality of light emitting diodes (LEDs);
    measuring at least one parameter associated with each of the plurality of LEDs to determine whether each of the plurality of LEDs is operational;
    selectively depositing an elastomer coating on a top surface of each of the plurality of LEDs determined to be operational.

2. The method of claim 1, further comprising approaching a pick-up head of a pick-up tool (PUT) towards at least one of the plurality of LEDs to attach at least one of the operational LEDs to the pick-up head via the elastomer coating deposited on the LED.

3. The method of claim 2, further comprising moving the pick-up head towards a display substrate to place the at least one operational LED on the display substrate.

4. The method of claim 1, further comprising placing the electrodes of the plurality of LEDs on a first surface of a unidirectional conductive film.

5. The method of claim 4, further comprising aligning sets of probes at an opposite surface of the unidirectional conductive film so that each set of probes is located at an opposite side of electrodes of a corresponding LED before applying the voltage difference across the electrodes of the LED, and wherein the voltage difference is applied across the electrodes by applying a voltage signal across each set of probes.

6. The method of claim 4, further comprising:
    forming the plurality of LEDs on a substrate; and
    transferring the plurality of LEDs from the substrate to the conductive surface.

7. The method of claim 1, wherein the elastomer coating comprises a conformable layer allowing for substantially uniform adhesion distribution between the elastomer coating and a surface of a pick-up tool.

8. The method of claim 1, wherein the at least one parameter corresponds to a voltage parameter or a current parameter across the electrodes of each of the plurality of LEDs.

9. A non-transitory computer-readable storage medium, storing computer program instructions executable by a processor to perform operations comprising:
    applying, through a plurality of sets of probes, a voltage difference across electrodes of each of a plurality of light emitting diodes (LEDs);
    measuring at least one parameter associated with each of the plurality of LEDs to determine whether each of the plurality of LEDs is operational;
    selectively causing an elastomer deposition apparatus to deposit an elastomer coating on a top surface of each of the plurality of LEDs determined to be operational.

10. The non-transitory computer-readable storage medium of claim 9, the operations further comprising causing a pick-up head of a pick-up tool (PUT) to approach at least one of the plurality of LEDs to attach at least one of the operational LEDs to the pick-up head via the elastomer coating deposited on the LED.

11. The non-transitory computer-readable storage medium of claim 9, wherein the electrodes of the plurality of LEDs are placed on a first surface of a unidirectional conductive film opposite from the plurality of sets of probes.

12. The non-transitory computer-readable storage medium of claim 9, wherein the at least one parameter corresponds to a voltage parameter or a current parameter across the electrodes of each of the plurality of LEDs.

* * * * *

UNITED STATES PATENT AND TRADEMARK OFFICE
CERTIFICATE OF CORRECTION

PATENT NO. : 10,559,507 B1
APPLICATION NO. : 15/890166
DATED : February 11, 2020
INVENTOR(S) : Pooya Saketi and Patrick Joseph Hughes

Page 1 of 1

It is certified that error appears in the above-identified patent and that said Letters Patent is hereby corrected as shown below:

In the Claims

Column 11, Line 22, Claim 1, delete "A method, comprising" and insert --A method comprising--.

Signed and Sealed this
Twenty-second Day of September, 2020

Andrei Iancu
*Director of the United States Patent and Trademark Office*